United States Patent
Oshikiri et al.

(10) Patent No.: US 9,840,568 B2
(45) Date of Patent: Dec. 12, 2017

(54) POLYMER AND METHOD FOR PRODUCING SAME

(75) Inventors: Tomoya Oshikiri, Yokohama (JP); Atsushi Yasuda, Yokohama (JP)

(73) Assignee: Mitsubishi Chemical Corporation, Tokyo (JP)

( * ) Notice: Subject to any disclaimer, the term of this patent is extended or adjusted under 35 U.S.C. 154(b) by 211 days.

(21) Appl. No.: 14/122,801

(22) PCT Filed: May 30, 2012

(86) PCT No.: PCT/JP2012/063918
§ 371 (c)(1),
(2), (4) Date: Nov. 27, 2013

(87) PCT Pub. No.: WO2012/165473
PCT Pub. Date: Dec. 6, 2012

(65) Prior Publication Data
US 2014/0114034 A1    Apr. 24, 2014

(30) Foreign Application Priority Data

May 30, 2011 (JP) ................. 2011-120850
Dec. 19, 2011 (JP) ................. 2011-276658

(51) Int. Cl.
| C08F 2/38 | (2006.01) |
| G03F 7/039 | (2006.01) |
| C08F 220/18 | (2006.01) |
| C08F 20/18 | (2006.01) |
| C08F 4/04 | (2006.01) |

(52) U.S. Cl.
CPC .............. *C08F 2/38* (2013.01); *G03F 7/0392* (2013.01); *G03F 7/0397* (2013.01); *C08F 4/04* (2013.01); *C08F 20/18* (2013.01); *C08F 220/18* (2013.01); *C08F 2438/03* (2013.01)

(58) Field of Classification Search
CPC ..... C08F 2438/03; C08F 20/18; C08F 220/18
See application file for complete search history.

(56) References Cited

U.S. PATENT DOCUMENTS

| 2002/0193539 A1 | 12/2002 | Husemann et al. | |
| 2004/0024132 A1 | 2/2004 | Chiefari et al. | |
| 2004/0097674 A1 | 5/2004 | Suau et al. | |
| 2005/0112495 A1* | 5/2005 | Feiring ................. | C08F 220/26 430/270.1 |
| 2010/0152401 A1* | 6/2010 | Hirano ................. | C07D 493/14 526/270 |

FOREIGN PATENT DOCUMENTS

| CN | 1211993 A | 3/1999 |
| JP | 2002 508409 | 3/2002 |
| JP | 2002 241568 | 8/2002 |
| JP | 2003 212912 | 7/2003 |
| JP | 2004 501249 | 1/2004 |
| JP | 2005-156726 A | 6/2005 |
| JP | 2007-65504 A | 3/2007 |
| JP | 2007 515538 | 6/2007 |
| JP | 2007 526496 | 9/2007 |
| JP | 2008 268661 | 11/2008 |
| JP | 2009-9114 A | 1/2009 |
| JP | 2010 100744 | 5/2010 |
| WO | WO 2011/004840 A1 | 1/2011 |

OTHER PUBLICATIONS

Chong, Y. et al., "Thiocarbonylthio End Group Removal from RAFT—Synthesized Polymers by Radical-Induced Reduction", Macromolecules 2007, 40(13), 4446-4455.*
Spruell, J. et al., "Facile Postpolymerization End-Modification of RAFT Polymers", Journal of Polymer Science: Part A: Polymer Chemistry 2009, 47, 346-356.*
International Search Report dated Sep. 11, 2012 in PCT/JP12/063918 Filed May 30, 2012.
Combined Chinese Office Action and Search Report dated Sep. 12, 2014 in Patent Application No. 201280026483.1 (with English Translation).
Office Action dated Oct. 11, 2016 in Japanese Patent Application No. 2012-530001 (with English translation).
Japanese Office Action dated Mar. 28, 2017 in Patent Application No. 2012-530001 (with unedited computer generated English translation).

* cited by examiner

*Primary Examiner* — Richard A Huhn
(74) *Attorney, Agent, or Firm* — Oblon, McClelland, Maier & Neustadt, L.L.P.

(57) ABSTRACT

The time when at least a monomer and a chain transfer agent are supplied in a reactor and the solution temperature in the reactor has reached a predetermined polymerization temperature is set as starting time ($T_0$), and the time when a process to terminate the polymerization is started is set as ending time ($T_1$). A polymerization initiator is supplied into the reactor between ($T_0$) and just before $[(T_1)-(T_0)/2]$ and between $[(T_1)-(T_0)/2]$ and ($T_1$). The total mass of the polymerization initiator supplied to the reactor between ($T_0$) and ($T_1$) is set as ($I_A$), and the total mass of the polymerization initiator supplied between $[(T_0-T_1)/2]$ and ($T_1$) is set as ($I_B$). The ($I_A$) is set 50 to 100 mass % of the entire polymerization initiator. Using a production method in which $0.50<(I_B)/(I_A)<1.00$ is satisfied, a polymer is produced at a high polymerization rate showing less variation of molecular weight and having less amount of chain transfer agent residue remaining at an end of the polymer chain.

20 Claims, No Drawings

POLYMER AND METHOD FOR PRODUCING SAME

FIELD OF THE INVENTION

The present invention relates to a polymer and its production method.

The present application is based upon and claims the benefit of priority to Japanese Patent Application Nos. 2011-120850, filed May 30, 2011, and 2011-276658, filed Dec. 19, 2011. The contents of these applications are entirely incorporated herein by reference.

BACKGROUND OF THE INVENTION

In the production process of semiconductor elements, liquid crystal elements and the like, miniaturization of patterns formed using lithographic techniques is being undertaken rapidly. To form miniaturized patterns, it is an option to employ a shorter wavelength for irradiation.

In recent years, lithographic techniques using KrF excimer laser beams (wavelength: 248 nm) have been introduced, and lithographic techniques involving ArF excimer laser beams (wavelength: 193 nm) with an even shorter wavelength and EUV rays (wavelength: 13.5 nm) have also been studied.

In addition, as for resist compositions to be used preferably in response to shorter wavelengths of irradiation light and miniaturized patterns, so-called chemically amplified resist compositions, which contain photoacid generators and polymers capable of dissolving in alkaline solutions after acid-leaving groups are removed by the action of acid, have been proposed and their further development and improvement are in progress.

Acrylic polymers having properties of transparency to light with a wavelength of 193 nm are notable for polymers in chemically amplified resist compositions used in ArF excimer laser lithography.

In addition, methods for producing polymer compounds by reversible addition-fragmentation chain transfer (RAFT) are gathering attention. A method using RAFT is a type of living radical polymerization method. In RAFT methods, a compound capable of causing reversible addition-fragmentation chain transfer reactions is used as a chain transfer agent (hereinafter referred to as a RAFT agent), and polymers with a remarkably narrow molecular-weight distribution range are obtained. For example, patent publications 1 and 2 below describe inventions relating to methods for synthesizing polymer compounds using various thiocarbonylthio compounds as RAFT agents.

Also, patent publication 3 describes an invention relating to a method for synthesizing a polymer using a RAFT agent, isolating the polymer, and then removing the RAFT agent remaining at an end of the polymer.

PRIOR ART PUBLICATION

Patent Publication

Patent Publication 1: PCT International Publication 2007-526496
Patent Publication 2: Japanese Laid-Open Patent Publication 2008-268661
Patent Publication 3: PCT International Publication 2007-515538

SUMMARY OF THE INVENTION

Problem(S) to be Solved by the Invention

However, in the methods described in patent publications 1 and 2 above, solubility of a polymer for lithographic use or the sensitivity of a resist composition may be insufficient.

Namely, since RAFT agent residue as a dormant species remains at an end of the polymer chain (end of a growing polymer chain) obtained by a living radical polymerization as described above, such RAFT agent residue is thought to cause a decrease in the solubility of the polymer or the sensitivity of the resist composition. For example, since RAFT agent residue with unsaturated bonds in its structure has a strong absorption band in the UV region, it is thought that a polymer using the RAFT agent inhibits transmission of UV light, resulting in lowered sensitivity of the resist composition formed using such a polymer. Although patent publication 3 describes a method for removing RAFT agent residue to solve the above-mentioned problem, the procedure is too complex to achieve high productivity.

In addition, RAFT agent residue at an end of the polymer chain tends to deteriorate over time and impurities such as acid are likely to be produced, thus reducing the stability of the polymer. Especially, when a polymer includes a structural unit having a group to be modified by acid, the modification reactions of the group by acid are promoted by such acidic impurity. Thus, the stability of the polymer tends to be lowered.

Also, chain propagation rates are usually low in RAFT methods compared with conventional radical polymerization, and sufficient polymerization rates may not be achieved.

The present invention was carried out in consideration of the problems described above. Its objective is to achieve at least one of the following problems.

There is provided a method for producing a polymer at a high polymerization rate, resulting in less RAFT agent residue remaining at an end of the polymer chain and in less variation of molecular weight.

There is provided a method for producing a polymer, by which a polymer with excellent stability is obtained with less variation of molecular weight.

There is provided a method for producing a polymer at a high polymerization rate with less variation of molecular weight; when such a polymer is used for a resist composition, solubility in a solvent and transmittance of light for lithographic exposure to light are enhanced.

There is provided a polymer that includes a structural unit having a group to be modified by acid; such a polymer shows less variation of molecular weight and excellent stability, and has less RAFT residue remaining at an end of the polymer chain.

Means of Solving the Problems

The above problems are solved by <1> through <9> below relating to the present invention.

<1> A polymer including a structural unit having a group to be modified by acid,
wherein the proportion of an end group having a thiocarbonylthio structure to all the growing end groups of the polymer is set at 0.001 to 30 mol %, and the proportion of the number of structural units that act as organic acid is less than 2 mol %.

<2> The polymer described in <1>, wherein the weight-average molecular weight of the polymer measured by gel permeation chromatography (GPC) using a differential refractive index detector and determined in terms of polystyrene is 2,500 to 1,000,000, and the peak area corresponding to a molecular weight of no greater than 1,000 in the elution curve is no greater than 1.0% of all the peak areas of the polymer.

<3> The polymer described in <1> or <2>, wherein the polymer is used for lithography applications.

<4> The polymer described in any one of <1> to <3>, wherein the group to be modified by acid is an acid leaving group.

<5> The polymer described in any one of <1> to <3>, further containing a structural unit having a group with a lactone skeleton.

<6> The polymer described in any one of <1> to <3>, further containing a structural unit having a hydrophilic group.

<7> A method for producing a polymer, including: a step in which a monomer in a reaction mixture is subjected to polymerization while maintaining a predetermined polymerization temperature in a reactor that contains the monomer, a polymerization initiator and a chain transfer agent having a thiocarbonylthio structure; a step in which the polymerization is terminated; a step in which the polymerization initiator is supplied to the reactor between ($T_0$) and just before [($T_1-T_0$)/2]; and a step in which the polymerization initiator is supplied to the reactor between [($T_1-T_0$)/2] and ($T_1$), provided that, when the time at which at least the monomer and the chain transfer agent are supplied into the reactor and the liquid temperature in the reactor has reached the polymerization temperature is set at starting time ($T_0$), and the time at which a process has started to terminate the polymerization is set as ending time ($T_1$), and when the total mass of the polymerization initiator supplied to the reactor between ($T_0$) and ($T_1$) is set as ($I_A$), and the total mass of the polymerization initiator supplied between [($T_1-T_0$)/2] and ($T_1$) is set as ($I_B$), the ($I_A$) is 50 to 100 mass % of the entire mass of the polymerization initiator to be supplied to the reactor and satisfies formula (I) below.

$$0.50 < I_B/I_A < 1.00 \quad (I)$$

<8> A method for producing a polymer, including: a step in which a monomer in a reaction mixture is subjected to polymerization while maintaining a predetermined polymerization temperature in a reactor that contains the monomer, a polymerization initiator and a chain transfer agent having a thiocarbonylthio structure; and a step in which the polymerization is terminated, wherein the polymerization is conducted in the presence of a basic compound.

<9> The method for producing a polymer described in <7> or <8>, further including a purification step after the step in which the polymerization is terminated, wherein the purification step includes a step in which the reaction mixture containing the polymer is brought into contact with a polar protic poor solvent, and a step in which the mixture is brought into contact with a nonpolar aprotic poor solvent.

Effects of the Invention

Using a method for producing a polymer related to the present invention, a polymer is obtained at a high polymerization rate with less variation of molecular weight, while RAFT agent residue remaining at an end of the polymer chain is reduced, thus enhancing the solubility of the polymer to a solvent and light transmittance of lithographic irradiation light when the polymer is used for forming a resist composition.

According to an embodiment of the present invention, a polymer is obtained having a structural unit that includes a group to be modified by acid. Such a polymer shows less variation of molecular weight and less RAFT agent residue remaining at an end of the polymer chain, and has a reduced amount of acid.

The less the acid in a polymer that includes a structural unit having a group to be modified by acid, the better the stability is during polymerization or storage.

The polymer related to the present invention is suitable to be used for lithography applications.

PREFERRED MODE TO CARRY OUT THE INVENTION

In the present application, "(meth)acrylic acid" means acrylic acid or methacrylic acid, and "(meth)acryloyloxy" means acryloyloxy or methacryloyloxy.

A weight-average molecular weight (Mw) and a molecular weight distribution (Mw/Mn) of a polymer in the present application is the value obtained using gel permeation chromatography (GPC) and converted in terms of polystyrene.

A preferred embodiment of the polymer related to the present invention is described.

<Polymer>

A polymer of the present embodiment is a copolymer having structural units of ($\alpha'_1$ to $\alpha'_n$) (structural units of ($\alpha'_1$ to $\alpha'_n$) indicate those derived respectively from monomers ($\alpha_1$ to $\alpha_n$). Here, "n" is an integer of 2 or greater.) The upper limit of "n" is preferred to be no greater than 6 because the effects of the present invention are more likely to be achieved. Especially, "n" is more preferred to be 5 or smaller, even more preferred to be 4 or smaller, when the polymer is used for resist.

For example, when n=3, it is a terpolymer P ($\alpha'_1/\alpha'_2/\alpha'_3$) formed with structural units ($\alpha'_1$, $\alpha'_2$, $\alpha'_3$); and when n=4, the polymer is a quaterpolymer P ($\alpha'_1/\alpha'_2/\alpha'_3/\alpha'_4$) formed with structural units ($\alpha'_1$, $\alpha'_2$, $\alpha'_3$, $\alpha'_4$).

For the polymer according to the present embodiment, the weight-average molecular weight (Mw) is preferred to be set in a range of 2,500 to 1,000,000, more preferably 3,000 to 500,000, and even more preferably 3,500 to 250,000.

Use of the polymer of the present embodiment is not limited specifically. For example, it is preferred to be used for lithographic applications (in a lithography step). Examples are polymers for forming resist films, polymers for antireflective coating layered on top of a resist film (TARC) or layered beneath a resist film (BARC), polymers for forming gap-fill films, polymers for forming topcoat films, and the like.

The weight-average molecular weight (Mw) of a polymer for lithographic applications is preferred to be 2,500 to 200,000, more preferably 2,500 to 40,000.

The molecular-weight distribution (Mw/Mn) is preferred to be 1.0 to 2.0, more preferably 1.01 to 1.5.

The structural units of the polymer are not limited specifically, and are selected appropriately according to usage purposes and properties required for the polymer.

The polymer is preferred to contain a structural unit having a group to be modified by acid. A group to be modified by acid means a functional group whose chemical structure is modified by acid. Particular examples of such a group to be modified by acid are later-described acid leaving groups, groups to be condensed by acid, groups to be hydrolyzed by acid, groups to be bonded with acid, and the like.

Polymers for resist applications are preferred to include a structural unit having an acid leaving group and a structural unit having a polar group. Other than those, a well-known structural unit may also be included.

The weight-average molecular weight (Mw) of a polymer for resist is preferred to be 2,500 to 100,000, more preferably 3,000 to 30,000.

The molecular distribution (Mw/Mn) is preferred to be 1.0 to 2.0, more preferably 1.01 to 1.5.

To avoid being mixed with the resist film, polymers for forming antireflective films are preferred to include a structural unit having a light-absorbing group along with a structural unit having a reactive functional group such as amino groups, amide groups, hydroxyl groups and epoxy groups which are curable when reacted with curing agents.

A light-absorbing group has properties for absorbing light in a wavelength range to which the photosensitive component of a resist composition reacts to show photosensitivity. Examples are groups having ring structures such as an anthracene ring, naphthalene ring, benzene ring, quinoline ring, quinoxaline ring, thiazole ring and the like (may contain any substituent). When KrF laser beams are used for irradiation, an anthracene ring or an anthracene ring with any optional substituent is preferred, and when ArF laser beams are irradiated, a benzene ring or a benzene ring with any optional substituent is preferred.

Examples of any optional substituent are phenolic hydroxyl groups, alcoholic hydroxyl groups, carboxyl groups, carbonyl groups, ester groups, amino groups and amide groups.

To achieve excellent development results and high resolution, especially preferred are polymers for forming antireflective films having a protected or non-protected phenolic hydroxyl group as a light-absorbing group.

Examples of structural units or monomers having above-described light-absorbing groups are benzyl (meth)acrylate, p-hydroxyphenyl (meth)acrylate and the like.

Polymers for gap-fill film are preferred to include a structural unit having a reactive functional group that is curable through reactions with a curing agent so as to avoid being mixed with the resist film or antireflective film, while having proper viscosity necessary to infiltrate narrow gaps.

Specific examples of such polymers are copolymers with at least one monomer selected from a hydroxystyrene, styrene, alkyl (meth)acrylate, hydroxyalkyl (meth)acrylate, and the like.

Examples of polymers used in topcoat film for immersion lithography are a copolymer that includes a structural unit having a carboxyl group, a copolymer that includes a structural unit having a fluorine-containing group with a substituted hydroxyl group, and the like.

<Structural Unit or Monomer>

A polymer is obtained by polymerizing monomers ($\alpha_1$ to $\alpha_n$) corresponding respectively to its structural units ($\alpha'_1$ to $\alpha'_n$). Monomers are each preferred to be a compound having a vinyl group, especially those that are likely to cause radical polymerization. Especially, (meth)acrylate ester is preferred in lithographic applications using light with a wavelength of 250 nm or shorter, since it has high transmittance of light with a wavelength of 250 nm or shorter used for exposure to light.

In the following, preferred structural units and their corresponding monomers are described for polymers for resist applications.

[Structural Unit or Monomer Having Acid Leaving Group]

Polymers for resist applications are preferred to have an acid leaving group. "Acid leaving group" means a group having a bond that is cleavable by acid. The acid leaving group is partially or entirely removed from the polymer structure through cleavage of the bond. In a polymer that includes a structural unit having an acid leaving group, the dissolution rate in an alkaline solution increases by the action of acid. After the acid leaving group is partially or entirely removed by the action of acid, the structural unit acts as organic acid.

In a resist composition, the polymer that includes a structural unit having an acid leaving group reacts with an acid component to be soluble in an alkaline developing solution (alkaline solution), and thus exhibits actions capable of forming resist patterns.

Examples of an alkaline developing solution are a solution of tetramethylammonium hydroxide with a concentration of 2.38 mass %, a solution of sodium hydroxide with a normality of 0.001, and the like.

The proportion of the structural unit having an acid leaving group is preferred to be at least 20 mol %, more preferably 25 mol %, relative to all the structural units (100 mol %) of the polymer from the viewpoint of sensitivity and resolution. In addition, considering adhesiveness to a substrate or the like, the proportion is preferred to be no more than 60 mol %, more preferably no more than 55 mol %, even more preferably no more than 50 mol %.

The amount of the structural unit having an acid-leaving group relative to all the structural units is preferred to be 20 to 60 mol %, more preferably 25 to 55 mol %, even more preferably 25 to 50 mol %.

As for a monomer having an acid leaving group, any well-known type may be used as long as it is a compound having an acid leaving group and a polymerizable multiple bond. Polymerizable multiple bonds are those cleavable during polymerization to form copolymer chains. Ethylenic double bonds are preferred.

Specific examples of a monomer having an acid leaving group are (meth)acrylate esters having an alicyclic hydrocarbon group with 6 to 20 carbon atoms along with an acid leaving group. Such an alicyclic hydrocarbon group may be directly bonded with an oxygen atom of the ester bond in the (meth)acrylate ester, or may be bonded via a linking group such as an alkylene group.

Above (meth)acrylate esters include: a (meth)acrylate ester having an alicyclic hydrocarbon group with 6 to 20 carbon atoms, and having a tertiary carbon atom at the linkage with an oxygen atom in the ester bond of (meth) acrylate ester; and a (meth)acrylate ester having an alicyclic hydrocarbon group with 6 to 20 carbon atoms, and a (—COOR) group ("R" indicates a tertiary hydrocarbon group, tetrahydrofuranyl group, tetrahydropyranyl group or oxepanyl group that may include a substituent) is bonded directly or via a linking group with the alicyclic hydrocarbon group. Examples of a linking group are an alkylene group, a divalent linking group having an alicyclic hydrocarbon structure, a divalent group having a single bond, an ether group (—O—), an ester group (—COO—), a carbonyl group (—CO—) or a combination thereof.

Especially, when a polymer is used for resist compositions to form patterns exposed to light with a wavelength of 250 nm or shorter, examples of preferred monomers having an acid leaving group are: 2-methyl-2-adamantyl (meth)acrylate, 2-ethyl-2-adamantyl (meth)acrylate, 1-(1'-adamantyl)-1-methylethyl (meth)acrylate, 1-methyl cyclohexyl (meth)acrylate, 1-ethyl cyclohexyl (meth)acrylate, 1-methyl cyclopentyl (meth)acrylate, 1-ethyl cyclopentyl (meth)acrylate, isopropyl adamantyl (meth)acrylate, 1-ethyl cyclooctyl (meth)acrylate, and the like.

Among those, 1-ethyl cyclohexyl methacrylate, 2-ethyl-2-adamantyl methacrylate, 1-ethyl cyclopentyl methacrylate, and isopropyl adamantyl methacrylate are more preferable.

Monomers having an acid leaving group may be used alone or in combination of two or more types.

[Structural Unit or Monomer Having Polar Group]

"Polar groups" are those having polar functional groups or groups of polar atoms. Specific examples are a hydroxyl group, cyano group, alkoxy group, carboxy group, amino group, carbonyl group, group containing a fluorine atom, group containing a sulfur atom, group with a lactone skeleton, group containing an acetal structure, group containing an ether bond, or the like.

Among those, a polymer for resist applied to a method for forming patterns by exposure to light with a wavelength of 250 nm or shorter is preferred to include a structural unit having a lactone skeleton, or a structural unit having a later-described hydrophilic group, as its structural unit having a polar group. It is more preferred to include both a structural unit having a group with a lactone skeleton and a structural unit having a later-described hydrophilic group.

When a polymer that includes a structural unit having a group to be modified by acid also includes a structural unit having a group with a lactone skeleton, the polymer exhibits excellent adhesiveness to a substrate or the like.

When a polymer that includes a structural unit having a group to be modified by acid also includes a structural unit having a hydrophilic group, the polymer has excellent wettability to a developing solution, thus the resist patterns result in excellent rectangular shapes.

(Structural Unit or Monomer Having a Group with Lactone Skeleton)

Lactone skeletons are those having 4- to 20-membered rings, for example. A lactone skeleton may be formed with a single lactone ring, or the lactone ring may be fused with an aliphatic or aromatic carbon ring or a heterocycle.

When a copolymer includes a structural unit having a group with a lactone skeleton, the amount is preferred to be at least 20 mol %, more preferably at least 35 mol %, to all the structural units (100 mol %), considering adhesiveness to a substrate or the like. In addition, when sensitivity and resolution are considered, its amount is preferred to be 60 mol % or less, more preferably 55 mol % or less, even more preferably 50 mol % or less.

The amount of the structural unit having a group with a lactone skeleton to all the structural units is preferred to be 20 to 60 mol %, more preferably 20 to 55 mol %, even more preferably 35 to 50 mol %.

As a monomer having a group with a lactone skeleton, at least one type selected from (meth)acrylate esters having a substituted or unsubstituted δ-valerolactone ring and monomers having a substituted or unsubstituted γ-butyrolactone ring is preferred because of excellent adhesiveness to a substrate or the like. A monomer having an unsubstituted γ-butyrolactone ring is especially preferred.

Examples of a monomer having a group with a lactone skeleton are β-(meth)acryloyloxy-β-methyl-δ-valerolactone, 4,4-dimethyl-2-methylene-γ-butyrolactone, β-(meth)acryloyloxy-γ-butyrolactone, β-(meth)acryloyloxy-β-methyl-γ-butyrolactone, α-(meth)acryloyloxy-γ-butyrolactone, 2-(1-(meth)acryloyloxy)ethyl-4-butanolide, (meth)acrylic acid pantoyl lactone, 5-(meth)acryloyloxy-2,6-norbornane carbolactone, 8-methacryloxy-4-oxatricyclo[5.2.1.0$^{2,6}$]decane-3-one, 9-methacryloxy-4-oxatricyclo[5.2.1.0$^{2,6}$]decane-3-one and the like.

As a monomer having a similar structure, methacryloyloxy succinic anhydride and the like are also listed.

Among these, more preferable are α-methacryloyloxy-β-butyrolactone, α-acryloyloxy-γ-butyrolactone, 5-methacryloyloxy-2,6-norbornane carbolactone, 8-methacryloxy-4-oxatricyclo[5.2.1.0$^{2,6}$]decane-3-one.

Monomers having a group with a lactone skeleton may be used alone or in combination of two or more.

(Structural Unit or Monomer Having Hydrophilic Group)

In the present application, "hydrophilic groups" indicate at least one of the following: —C(CF$_3$)$_2$—OH, a hydroxyl group, cyano group, methoxy group, carboxyl group and amino group.

Among those, a polymer for resist applied to a method for forming patterns by exposure to light with a wavelength of 250 nm or shorter is preferred to have a hydroxyl group or cyano group as its hydrophilic group.

In a copolymer, the amount of the structural unit having a hydrophilic group is preferred to be 5 to 50 mol %, more preferably 10 to 25 mol %, to all the structural units (100 mol %) in view of the resulting rectangular shapes of resist patterns.

Examples of a monomer having a hydrophilic group are (meth)acrylate ester having a terminal hydroxyl group; derivatives having a substituent such as an alkyl group, hydroxyl group, carboxyl group and the like on a hydrophilic group of the monomer; monomers having a cyclic hydrocarbon group (such as cyclohexyl (meth)acrylate, 1-isobornyl (meth)acrylate, adamantyl (meth)acrylate, tricyclodecanyl (meth)acrylate, dicyclopentyl (meth)acrylate, 2-methyl-2-adamantyl (meth)acrylate, 2-ethyl-2-adamantyl methacrylate, and the like) and including a hydrophilic group such as a hydroxyl group and a carboxyl group as its substituent.

Examples of a monomer having a hydrophilic group are (meth)acrylic acid, 2-hydroxyethyl (meth)acrylate, 3-hydroxypropyl (meth)acrylate, 2-hydroxy-n-propyl (meth)acrylate, 4-hydroxybutyl (meth)acrylate, 3-hydroxyadmantyl (meth)acrylate, 2- or 3-cyano-5-norbornene (meth)acrylate, 2-cyanomethyl-2-adamantyl (meth)acrylate and the like. Considering the adhesiveness to a substrate or the like, 3-hydroxyadamantyl (meth)acrylate, 2- or 3-cyano-5-norbornene (meth)acrylate, 2-cyanomethyl-2-adamantyl (meth)acrylate and the like are preferred.

Among those, 3-hydroxyadamantyl methacrylate is more preferred.

Monomers with a hydrophilic group may be used alone or in combination of two or more monomers.

<Polymerization Initiator>

As for a polymerization initiator, it is preferred for it to thermally decompose efficiently to generate radicals and for its 10-hour half-life temperature to be at the polymerization temperature or lower. For example, a preferred polymerization temperature for producing a polymer for a lithographic application is 40 to 150° C., and it is preferred to use a polymerization initiator with a 10-hour half-life temperature at 40 to 70° C. Also, for the polymerization initiator to efficiently decompose, the difference between the polymerization temperature and the 10-hour half-life temperature of the polymerization initiator is preferred to be at least 10° C.

Examples of a polymerization initiator are azo compounds such as 2,2'-azobisisobutyronitrile, dimethyl-2,2'- azobisisobutylate, 2,2'-azobis(2,4-dimethylvaleronitrile), and 2,2'-azobis[2-(2-imidazolin-2-yl)propane]; and organic peroxides such as 2,5-dimethyl-2,5-bis(tert-butylperoxy) hexane, di(4-tert-butylcyclohexyl) peroxydicarbonate and the like. Azo compounds are more preferable.

Those compounds are commercially available. For example, dimethyl 2,2'-azobisisobutylate (brand name: V601, made by Wako Pure Chemical Industries, Ltd., 10-hour half-life temperature of 66° C.), 2,2'-azobis(2,4-dimethylvaleronitrile) (brand name: V65, made by Waco Chemical Industries, Ltd., 10-hour half-life temperature of 51° C.) or the like may be used preferably.

<Chain Transfer Agent Having Thiocarbonylthio Structure (Raft Agent)>

If a chain transfer agent (RAFT agent) having a thiocarbonylthio structure (—S—C(=S)—) is used along with a polymerization initiator when a monomer is polymerized, a narrow-dispersion polymer is obtained.

A chain transfer agent having a thiocarbonylthio structure used in the present embodiment is not limited specifically, but compounds represented by the following formulas (1) to (9) are preferred considering availability and polymerization results.

chemical formulas 1

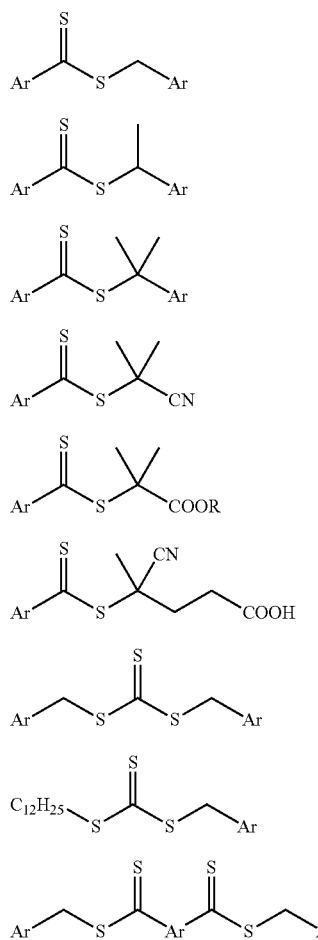

In formulas (1) to (9), "Ar" indicates an aromatic group or substituted aromatic group; the substituent is a halogen atom, hydrogen group, alkoxy group, amino group, nitro group, cyano group, group containing carbonyl represented by —CORa (Ra is an alkyl group or allyl group having 1 to 8 carbon atoms, an alkoxy group or allyloxy group having 1 to 8 carbon atoms), a sulfonyl group, or a trifluoromethyl group. "R" indicates an alkyl group or allyl group having 1 to 8 carbon atoms.

When two "Ar" groups are present in one molecule, they may be the same or different.

Among those, compounds represented by formula (3) or (4) are preferred since polymerization is easier to control with excellent reaction progress. When a compound represented by formula (3) or (4) is used as a RAFT agent, RAFT agent residue remaining at an end of the polymer chain is represented by the following formula (10).

chemical formula 2

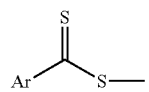

<Polymerization Solvent>

A polymerization solvent may be used when a monomer is polymerized. Examples of a polymerization solvent are as follows: ethers: chain ethers (such as diethylether and propylene glycol monomethyl ether) and cyclic ethers (such as tetrahydrofuran (hereinafter may be referred to as "THF") and 1,4-dioxyan); esters: methyl acetate, ethyl acetate, butyl acetate, ethyl lactate, butyl lactate, propylene glycol monomethyl ether acetate (hereinafter may be referred to as "PGMEA"), α-butyrolactone and the like; ketones: acetone, methyl ethyl ketone, methyl isobutyl ketone and the like; amides: N,N-dimethylacetamide, N,N-dimethylformamide and the like; sulfoxides: dimethyl sulfoxide and the like; aromatic hydrocarbons: benzene, toluene, xylene and the like; aliphatic hydrocarbons: hexane and the like; alicyclic hydrocarbons: cyclohexane and the like. Those polymerization solvents may be used alone or in combination of two or more.

The amount of a polymerization solvent is not limited specifically, but when the polymerization is finished, the solid content of the solution (polymerization mixture) in the reactor is preferred to be approximately 20 to 60 mass %.

Among the above polymerization solvents, PGMEA, γ-butyrolactone or methyl ethyl ketone is preferred since it is easier to obtain a high-purity solvent and those solvents do not inhibit the control action of a RAFT agent. Moreover, it is preferred to combine any two of PGMEA, γ-butyrolactone and methyl ethyl ketone because such combined solvents are capable of dissolving a wide range of polar polymers.

A method for producing a polymer is described according to an embodiment of the present invention.

<Method for Producing Polymer>

According to the method for producing a polymer of the present embodiment, a monomer, a polymerization initiator and a chain transfer agent (RAFT agent) having a thiocarbonylthio structure are supplied in a reactor, and the monomer is polymerized in a reaction mixture at a predetermined polymerization temperature so that a polymer is produced after a step to terminate the reaction.

Well-known polymerization methods such as bulk polymerization, solution polymerization, suspension polymerization, emulsion polymerization or the like may be employed. Among those, solution polymerization is preferred, since it is easier to conduct a step for removing monomer residue after the reaction is finished so as not to reduce light transmittance, and the molecular weight of the obtained polymer is set relatively low.

The method for producing a polymer according to the present embodiment includes a step for in which at least a monomer and a chain transfer agent (RAFT agent) are supplied in a reactor, a step in which the liquid in the reactor is heated to a predetermined polymerization temperature, a step in which a polymerization initiator is supplied in the reactor, a step in which polymerization is conducted by maintaining the liquid temperature in the reactor at the polymerization temperature, and a step in which the polymerization is terminated. When the liquid containing at least a monomer and a polymerization initiator is maintained at the polymerization temperature, polymerization makes progress.

In the present embodiment, after at least a monomer and a chain transfer agent (RAFT agent) are supplied in a reactor, the time that the liquid temperature in the reactor reaches a predetermined polymerization temperature is set as starting time ($T_0$), and the time at which a process for terminating the reaction starts is set as ending time ($T_1$).

In the present embodiment, "when the liquid temperature in the reactor has reached a predetermined polymerization temperature" means that when a liquid in the reactor is heated to and maintained at a predetermined temperature to carry out polymerization, the liquid has reached the polymerization temperature (at a specified value). For example, when polymerization is carried out by setting the temperature in the reactor at 80° C., the polymerization temperature is 80° C., and the time when the liquid temperature in the reactor has reached 80° C. is set as starting time ($T_0$).

In the present embodiment, the liquid temperature in the reactor during polymerization may be set within a certain range as long as polymerization progresses to obtain a polymer with a desired composition. However, it is preferred to maintain the temperature range at ±5° C., more preferably ±3° C., even more preferably ±1° C., of the predetermined polymerization temperature, to obtain a polymer having a desired molecular weight and showing fewer irregular results in quality such as its molecular weight or its composition when the polymer is produced multiple times.

The polymerization temperature in the present embodiment is not limited specifically, and may be set in any selected range. However, it is preferred to be set based on the boiling point of the solvent and a half-life temperature of the polymerization initiator. If the polymerization temperature is set too high, problems may arise in stability of the monomer and of the polymer to be produced subsequently. Generally, the polymerization temperature is preferred to be set at 40 to 150° C., more preferably at 40 to 140° C., even more preferably at 50 to 120° C.

To terminate the reaction, methods such as cooling the liquid in the reactor, putting a polymerization inhibitor into the reactor, blowing a gas containing oxygen into the reactor, adding a poor solvent of the polymer into the reactor so that the polymer will be precipitated and the like may be employed. Among those, cooling the reactor is preferred because of the ease of handling and a reduced chance of impurities being mixed into the reactor.

In any method to be taken, the time to start the process to terminate the reaction is set as ending time ($T_1$). In particular, if the reactor is cooled to terminate the reaction, the ending time ($T_1$) is when the cooling starts. When using a method for supplying or blowing a polymerization inhibitor, oxygen, a poor solvent or the like into the reactor to terminate the reaction, the ending time ($T_1$) is set when the process to supply or blow has started.

The duration ($T_1-T_0$) from starting time ($T_0$) to ending time ($T_1$) is preferred to be 1 to 24 hours, more preferably 2 to 18 hours, from the viewpoint of the polymerization rate of the monomer and production efficiency.

As for the method for supplying a monomer, it is an option to supply a predetermined amount all at once, or to add it drop by drop, into the reactor; or it may be a combination thereof. Alternatively, the monomer may be combined with a polymerization solvent and then supplied to the reactor.

The monomer is present in the reactor at starting time ($T_0$). Namely, the monomer used for polymerization is partially or entirely fed into the reactor before starting time ($T_0$). The amount of the monomer existing in the reactor at starting time ($T_0$) is preferred to be at least 10 mass %, more preferably at least 25 mass % of the entire amount of the monomer (100 mass %) to be used for polymerization. If the amount is at least the lower limit of the above range, polymerization tends to progress efficiently, and an excellent polymerization rate is more likely to be achieved.

As for a method for supplying a RAFT agent to the reactor, it is an option to supply a predetermined amount all at once, or to add it drop by drop into the reactor; or a combination thereof may be employed. Alternatively, a RAFT agent may be combined with a polymerization solvent and then supplied to the reactor. The amount of a RAFT agent is determined based on the amount of the monomer and the molecular weight of a polymer to be obtained.

The RAFT agent is present in the reactor at starting time ($T_0$). Namely, the RAFT agent used for polymerization is partially or entirely fed into the reactor before starting time ($T_0$). The amount of the RAFT agent existing in the reactor at starting time ($T_0$) is preferred to be at least 50 mass %, more preferably at least 75 mass %, most preferably 100 mass %, of the entire amount of the RAFT agent (100 mass %) to be used for polymerization. If the amount is at least the lower limit of the above range, a polymer tends to have a narrowed molecular-weight distribution range and shows less variation of molecular weight.

Namely, the entire amount of the RAFT agent is preferred to be supplied into the reactor no later than just before starting time ($T_0$).

The method of the present embodiment includes a step in which a polymerization initiator is supplied to the reactor between ($T_0$) and just before [($T_1-T_0$)/2] (hereinafter may be referred to as the first half of ($T_1-T_0$)), and a step in which the polymerization initiator is supplied to the reactor between [$T_1-T_0$)/2] and ($T_1$) (hereinafter may be referred to as the latter half of ($T_1-T_0$)). [$T_1-T_0$)/2] is included in the latter half of ($T_1-T_0$).

The polymerization initiator supplied to the reactor by just before [($T_1-T_0$)/2] contributes mostly to the polymerization of the monomer, while the polymerization initiator supplied to the reactor in the latter half of ($T_1-T_0$) contributes mostly to a reaction to remove the chain transfer agent residue (RAFT agent residue) from an end of the polymer chain.

The polymerization initiator to be supplied to the reactor by just before [($T_1-T_0$)/2] may be one type or a combination of two or more. The polymerization initiator to be supplied into the reactor in the latter half of ($T_1-T_0$) may be one type or a combination of two or more.

The polymerization initiator supplied to the reactor by just before [($T_1-T_0$)/2] may be the same as or different from the polymerization initiator supplied into the reactor in the latter half of ($T_1-T_0$).

The polymerization initiator may be partially supplied to the reactor at starting time ($T_0$). However, if the liquid in the reactor is heated after the polymerization initiator is supplied into the reactor, the stability of producing the polymer tends to decrease. One reason for such a reduction in stability is thought to be that the polymerization initiator supplied into the reactor before starting time ($T_0$) receives thermal history from the heat to raise the liquid temperature in the reactor.

Thus, the amount of the polymerization initiator to be supplied into the reactor before starting time ($T_0$) is preferred to be smaller. More specifically, the total amount (($I_A$) to be described later) of the polymerization initiator supplied into the reactor between ($T_0$) and ($T_1$) is preferred to be 50 to 100 mass %, more preferably 75 to 100 mass %, most preferably 100 mass %, relative to the entire amount of the polymerization initiator supplied to the reactor (100 mass %). Namely, the supply of the polymerization initiator to the reactor is especially preferred to start at or after starting time ($T_0$).

When considering the stability of the monomer and the RAFT agent in the reactor, the time to start supplying the polymerization initiator in the first half of ($T_1-T_0$) is preferred to be no later than 60 minutes, more preferably no later than 30 minutes, after the starting time ($T_0$). It may be zero, namely, starting time ($T_0$) and the starting time for supplying the polymerization initiator may be simultaneous.

In the latter half of ($T_1-T_0$), the duration from the start of supplying the polymerization initiator into the reactor until ending time ($T_1$) is preferred to be at least 30 minutes, more preferably at least 45 minutes, to sufficiently achieve the effect of reducing the RAFT agent residue remaining at an end of the polymer chain. In addition, considering the reduction in production time and the stability of the polymer, it is preferred to be no longer than 300 minutes, more preferably no longer than 150 minutes. A preferable range is 30 to 300 minutes, and a range of 45 to 150 minutes is more preferable.

In the first half of ($T_1-T_0$), the time from starting time ($T_0$) to the time to start supplying a polymerization initiator to the reactor is preferred to be no longer than 30 minutes, and the duration from the start of supplying the polymerization initiator to the reactor to ending time ($T_1$) in the latter half of ($T_1-T_0$) is preferred to be 45 to 150 minutes.

In the present embodiment, when the total amount of a polymerization initiator supplied to the reactor between ($T_0$) and ($T_1$) is set as ($I_A$), and the total amount of the polymerization initiator supplied between $[T_1-T_0)/2]$ and ($T_1$), namely, in the latter half of ($T_1-T_0$) is set as ($I_B$), the following formula (I) is satisfied.

$$0.50 < I_B/I_A < 1.00 \quad (I)$$

When the value of ($I_B$)/($I_A$) is in the above range, the RAFT agent residue remaining at an end of the polymer chain is effectively reduced, while a high polymerization rate is achieved. It is preferred to satisfy $0.60 \leq (I_B)/(I_A) \leq 0.99$, more preferably $0.80 \leq I_B/I_A \leq 0.99$.

The amount ($I_B$) of a polymerization initiator supplied to the reactor in the latter half of ($T_1-T_0$) is preferred to be 25 to 2000 mol %, more preferably 500 to 2000 mol % relative to the entire amount (100 mol %) of a RAFT agent.

To supply a polymerization initiator to the reactor in the latter half of ($T_1-T_0$), it is preferred to supply the entire amount all at once or to divide the amount into multiple portions, because the effect of eliminating the RAFT agent residue remaining at an end of the polymer chain is more likely to be achieved. The initiator may be combined with a polymerization solvent, or it may be a powder.

The amount (the entire amount of a polymerization initiator–($I_B$)) of a polymerization initiator supplied to the reactor by just before $[(T_1-T_0)/2]$ is preferred to be 10 to 100 mol %, more preferably 20 to 50 mol % relative to the entire amount (100 mol %) of a RAFT agent.

To supply a polymerization initiator to the reactor by just before $[(T_1-T_0)/2]$, the entire amount may be supplied all at once, divided into multiple portions, or added drop by drop; or any combination thereof may be employed. For polymerization to progress efficiently, supplying the entire amount all at once is preferred. The polymerization initiator may be combined with a polymerization solvent, or it may be a powder.

The following is a preferred embodiment of the method for producing a polymer of the present embodiment.

The entire amount of a monomer, the entire amount of a RAFT agent and a polymerization solvent if necessary are provided in advance into a reactor; and preferably after an inert gas (such as nitrogen gas) is blown into the reactor to displace the gas in the reactor (gas purging), the mixture in the reactor is heated to raise its temperature. After the liquid temperature in the reactor has reached a predetermined polymerization temperature (staring time ($T_0$)), the entire amount of a polymerization initiator to be supplied in the first half of ($T_1-T_0$) is fed into the reactor all at once, and polymerization is carried out at the predetermined temperature. After $[(T_1-T_0)/2]$, the entire amount of a polymerization initiator to be supplied in the latter half of ($T_1-T_0$) is provided all at once or portion by portion. After the polymerization has been carried out at the predetermined polymerization temperature, the reaction is terminated.

<Basic Compound>

When a reaction mixture containing a monomer, a polymerization initiator and a chain transfer agent (RAFT agent) having a thiocarbonylthio structure is supplied into a reactor to polymerize the monomer at a predetermined polymerization temperature, and the reaction is terminated in a method for producing a polymer, it is preferred to add a basic compound when the monomer is polymerized.

By adding a basic compound in the polymerization system, acid generated in the polymerization system is promptly neutralized. More specifically, when the thiocarbonylthio structure derived from the RAFT agent decomposes to generate acid during storage or polymerization, the decomposition process of the thiocarbonylthio structure is promoted by the acid, and when a group to be modified by acid is present in the system, modification reactions of the group are also promoted. When acid in the system is neutralized by the basic compound, decomposition of the thiocarbonylthio structure and modification of the group to be modified by acid are suppressed so that a polymer with desired properties is obtained.

Examples of a basic compound are 2-aminoethanol, diethanolamine, triethanolamine, trimethylamine, triethylamine, α-picoline, γ-picoline, γ-picoline, piperidine, pyridine, benzylamine, methoxyethylamine, aminopyridine, ethylenediamine and the like. Tertiary amines are preferred since they do not inhibit control by a RAFT agent. Especially preferred are triethanolamine, trimethylamine, triethylamine, α-picoline, β-picoline, γ-picoline, piperidine and pyridine. Basic compounds may be used alone or in combination of two or more. The amount of a basic compound to be added in a polymerization is not limited specifically. For example, it is preferred to be 1 to 100 mol %, more preferably 5 to 75 mol %, to the entire amount of a RAFT agent (100 mol %) used in the polymerization.

To supply a basic compound to the polymerization system, for example, the basic compound may be added in advance in the reactor prior to starting polymerization, the entire amount may be added after the polymerization has started, the supply amount may be divided into multiple portions or it may be added drop by drop, or any combination thereof may be employed. To efficiently suppress decomposition of a RAFT agent, it is preferred to add the entire amount all at once after the start of polymerization.

A basic compound may be mixed with a polymerization solvent or the monomer to be supplied, or a basic compound alone may be provided.

The polymerization mixture obtained when the reaction has been terminated is purified if necessary (purification process). Any well-known method may be employed for the purification process. For example, after the reaction mixture is diluted by a dilution solvent to be at a proper solution viscosity, the diluted mixture is added drop by drop into a poor solvent so that the polymer will be precipitated (resedimentation process). The precipitate is filtered to obtain a wet powder, which is then thoroughly dried. Accordingly, a dry-powder polymer is obtained.

Alternatively, after the filtered wet powder is dispersed again in a poor solvent to obtain a polymer dispersion, it is an option to repeat the filtration of the polymer more than once (reslurry process).

The purification process is preferred to include a step in which the polymer mixture is brought into contact with a polar protic poor solvent and a step in which the polymer mixture is brought into contact with a nonpolar aprotic poor solvent.

The polymer mixture means a product to be purified that contains a target polymer and impurities; for example, the polymerization mixture, polymer dispersion, powder containing the polymer and impurities, and solution containing the polymer dissolved again in a good solvent.

A polar protic poor solvent indicates a solvent having proton donating properties and a Hildebrand solubility parameter (hereinafter referred to as an SP value) of 20 $(MPa^{1/2})$ or greater. What is preferred is a solvent that forms a heterogeneous mixture with the polymer to be purified when they are combined at an equivalent weight at 20° C. under 1 atmospheric pressure.

Preferred examples of a polar protic poor solvent are water (SP value of 47.9), methanol (SP value of 29.7), ethanol (SP value of 26.0), 1-propanol (SP value of 24.3), 2-propanol (SP value of 23.5), 1-butanol (SP value of 23.3), 2-methyl-1-propanol (SP value of 21.5), 2-methyl-2-propanol (SP value of 21.7) and the like.

A nonpolar aprotic poor solvent means a solvent without a proton donor ability and a Hildebrand SP value of less than 20 $(MPa^{1/2})$. What is preferred is a solvent that forms a heterogeneous mixture with the polymer to be purified when they are combined at an equivalent amount at 20° C. under 1 atm.

Preferred examples of a nonpolar aprotic poor solvent are diisopropyl ether (SP value of 14.1), pentane (SP value of 14.3), isopropyl ether (SP value of 14.5), hexane (SP value of 14.9), diethyl ether (SP value of 15.1), heptane (SP value of 15.1) and the like.

A step in which the polymerization mixture is brought into contact with a polar protic poor solvent and a step in which the mixture is brought into contact with a nonpolar aprotic poor solvent are not limited to any specific order. When the mixture containing both the target polymer and impurities are brought into contact with both a polar protic poor solvent and a nonpolar aprotic poor solvent, low molecular compounds such as RAFT fragments with low polarity, monomers with low polarity, monomers with high polarity and the like are efficiently removed. As a result, a polymer is obtained, from which impurities with low molecular weights such as an unreacted monomer (residual monomer), residual solvent and RAFT fragments are well removed.

A step in which the polymerization mixture is brought into contact with a polar protic poor solvent and a step in which the mixture is brought into contact with a nonpolar aprotic poor solvent are conducted by combining the polymer mixture with the poor solvent to precipitate the polymer, by combining the polymer with the poor solvent to wash the polymer and then separate the solid and the liquid, by repulping or rinsing the polymer with the poor solvent or the like.

To reduce the residual poor solvent in the polymer, it is preferred to bring the mixture into contact with a nonpolar aprotic poor solvent and then to bring the mixture into contact with a polar protic poor solvent to wash the polymer.

According to the production method of the present embodiment, RAFT agent residue remaining at an end of the polymer chain is effectively reduced.

Also, by adding a basic compound to the polymerization system, the acid content in the polymer is reduced.

A polymer is obtained in which among all the growing end groups of the polymer, preferably the proportion of the end group having a thiocarbonylthio structure is 0.001 to 30 mol % and the proportion of the acid content to all the structural units (100 mol %) is no more than 2 mol %.

The proportion of the end group having a thiocarbonylthio structure to all the growing end groups of the polymer (100 mol %) is more preferred to be 0.001 to 15 mol %, and especially preferred to be 0.001 to 10 mol %.

The polymer of the present embodiment may contain impurities that are inevitably included in the production process. Such impurities are unreacted monomers (residual monomers), residual solvents, RAFT fragments and the like.

All the growing end groups of a polymer mean functional groups at the farthest ends where the polymer chain is extended by monomers attached continuously during the course of addition polymerization. The growing end groups of a polymer obtained by polymerization using a RAFT agent are either polymerization initiator residue (containing no sulfur atom) or RAFT agent residue (containing a sulfur atom). Their sum is the total of the growing end groups. The proportion of the end group having a thiocarbonylthio structure among all the growing end groups is obtained by analyzing the amount of the end group containing no sulfur atom (polymerization initiator residue) and the amount of the end group containing sulfur atoms (RAFT agent residue) using $^1$H-NMR.

In the present invention, acid in a polymer is an organic acid, and the acid content in the polymer is shown as the number of existing structural units that act as organic acid.

Organic acid is a general term for organic compounds that show acidity (pH<7) in water, meaning organic compounds having acidic functional groups such as carboxyl groups (—COOH), sulfo groups (—SO$_3$H), phenolic hydroxyl groups (—ArOH: Ar is an allyl group such as a phenyl group), mercapto group (—SH) and the like. A structural unit that acts as an organic acid is a structural unit having an acidic functional group.

The proportion (mol %) of the number of structural units that act as organic acid to the number of all the structural units of a polymer is the value obtained below.

Namely, the number of all the structural units (mol) of a polymer is obtained by nuclear magnetic resonance (NMR) spectroscopy, infrared (IR) spectroscopy or the like. Separately, the amount of the structural unit (mol) that acts as an organic acid is obtained by nuclear magnetic resonance (NMR) spectroscopy, infrared (IR) spectroscopy, titration or the like. Then, the proportion of the structural unit (mol %) that acts as an organic acid to all the structural units is calculated.

When the proportion of the structural unit that acts as an organic acid is 2 mol % or lower, decomposition of the thiocarbonylthio structure in the reaction system is well suppressed, and a polymer with desired properties is more likely to be obtained. Also, when a group to be modified by acid is present in the reaction system, modification of the group is well suppressed, and a polymer with desired properties is more likely to be obtained.

If the proportion of the end group having a thiocarbonylthio structure among all the growing end groups of a polymer is at least 0.001 mol %, it means the polymer is produced using a RAFT agent. To produce a polymer using a RAFT agent, variation of molecular weight of the polymer is improved and a distribution of molecular weights is narrowed.

When the proportion of the end group having a thiocarbonylthio structure is no more than 30 mol % to all the growing end groups of a polymer, and the proportion of a structural unit that acts as organic acid is no more than 2 mol % to all the structural units, RAFT agent residue remaining in the polymer is sufficiently low, and it is more likely to obtain effects such as improved solubility of the polymer in a solvent, and higher transmittance of irradiation light for lithography when the polymer is used for resist compositions.

A polymer according to a preferred embodiment contains a structural unit having a group to be modified by acid. The proportion of the end group having a thiocarbonylthio structure is 0.001 to 30 mol % to all the growing end groups (100 mol %) of the polymer, and the proportion of a structural unit that acts as organic acid is no more than 2 mol % to all the structural units.

Even if a polymer contains a structural unit having a group to be modified by acid, if the proportion of a structural unit that acts as organic acid is no more than 2 mol % to all the structural units of the polymer, modification of the group by acid is less likely to occur, and excellent stability is more likely to be achieved during polymerization or storage.

The proportion of the end group having a thiocarbonylthio structure is more preferred to be 0.001 to 15 mol %, and especially preferred to be 0.001 to 10 mol %, to all the growing end groups (100 mol %) of the polymer.

In the present embodiment, in an elution curve measured by gel permeation chromatography (GPC) and detected by a differential refractometer, the peak areas of molecular weights of no greater than 1000 are preferred to be 1.0% or less to all the peak areas.

The proportion of the peak areas of molecular weights of no greater than 1000 to all the peak areas is obtained as follows.

Generally speaking, when the molecular-weight distribution of a polymer is measured by GPC, as the elution volume (elution rate×elution time) increases, the logarithm of the molecular weight of the polymer in the eluent passing through the detector decreases steadily. Namely, the greater the molecular weight, the faster the elution from the column. Also, the signal intensity is proportionate to the amount of the polymer in the eluent passing through the detector. By creating a calibration curve representing the relationship between a molecular weight and elution time by using standard polystyrene, the elution curve detected by a differential refractometer is converted to a curve with the vertical axis for signal intensity and the horizontal axis for the logarithm of the molecular weight in terms of polystyrene (hereinafter referred to as a differential molecular weight curve).

In the present embodiment, when a base line is drawn to the differential molecular weight curve, the sum of all the positive peak areas (the areas with greater signal intensity than at the base line) is set as all the peak areas, and the sum of the positive peak areas of molecular weight of no greater than 1000 (the areas with greater signal intensity than at the base line) is set as the peak areas of molecular weight of no greater than 1000. Based on those, the proportion of the peak areas of molecular weight of no greater than 1000 to all the peak areas is obtained.

The conversion to the differential molecular weight curve, calculation of peak areas or the like is conducted using GPC 8020 model II, data analysis version 6.00, made by Tosoh Bioscience LLC or the like.

In low-molecular compounds having a molecular weight of no greater than 1000, unreacted monomers (residual monomers), residual solvents, RAFT fragments or the like may be contained. By controlling the amount of low-molecular compounds in a polymer at as low as 1% or less, a steady production result of polymers with desired properties is more likely to be achieved.

<Resist Composition>

A resist composition according to the present embodiment is a chemically amplified resist composition containing at least a polymer for lithographic use obtained by the production method of the present embodiment and a compound that generates acid by exposure to irradiation of actinic rays or radiation (hereinafter referred to as a photoacid generator). The resist composition is preferred to further contain a resist solvent. Examples of a resist solvent are the same as polymerization solvents.

The resist composition of the present embodiment is a chemically amplified resist composition using a polymer for lithography produced by the method according to the present embodiment. The resist composition exhibits properties such as excellent solubility in a resist solvent, high transmittance and excellent sensitivity.

<Photoacid Generator>

Any photoacid generator is selected from among well-known photoacid generators in chemically amplified resist compositions. A photoacid generator may be used alone, or in combination of two or more.

As for a photoacid generator, for example, onium salt compounds, sulfone imide compounds, sulfone compounds, sulfonic acid ester compounds, quinone diazide compounds, azomethane compounds or the like may be used.

The amount of a photoacid generator in a resist composition is preferred to be 0.1 to 20 parts by mass, more preferably 0.5 to 10 parts by mass, to 100 parts by mass of the polymer.

(Nitrogen-Containing Compound)

A chemically amplified resist composition may include a nitrogen-containing compound. By including a nitrogen-containing compound, resist-pattern shapes and the stability of latent images over time are further improved. Namely, the cross-sectional shapes of resist patterns are even closer to rectangular. In a mass-production line of semiconductor elements or the like, after light is irradiated on resist film, which is then baked (PEB), the wafers may be left for a few hours until a developing treatment is next conducted. In such a duration (over time), the cross-sectional shapes of resist patterns are further suppressed from deteriorating.

As for examples of a nitrogen-containing compound, amines are preferred; secondary lower aliphatic amines and tertiary lower aliphatic amines are more preferred.

The amount of a nitrogen-containing compound in a resist composition is preferred to be 0.01 to 2 parts by mass to 100 parts by mass of the polymer.

(Organic Carboxylic Acid, Phosphorous Oxoacid or Its Derivatives)

A chemically amplified resist composition may include organic carboxylic acid, phosphorus oxoacid or its derivatives (hereinafter, they are referred to as acidic compounds). By including an acidic compound, deterioration of sensitivity caused by adding a nitrogen-containing compound is suppressed, while resist-pattern shapes and stability of latent image over time are further improved.

Examples of organic carboxylic acid are malonic acid, citric acid, malic acid, succinic acid, benzoic acid, salicylic acid and the like.

Examples of a phosphorus oxoacid and its derivatives are phosphoric acid or its derivatives, phosphonic acid or its derivatives, and phosphinic acid or its derivatives.

The amount of an acidic compound in a resist composition is preferred to be 0.01 to 5 parts by mass to 100 parts by mass of the polymer.

(Additives)

If necessary, a resist composition of the present embodiment may include various additives such as surfactants, quenchers, sensitizers, halation inhibitors, preservation stabilizers, antifoaming agents and the like. As long as they are well known in the art, any type of additives may be used. The amount of such additives is not limited specifically and is determined properly as desired.

<Method for Manufacturing Substrate with Formed Patterns>

A method for manufacturing a substrate with patterns formed thereon according to the present embodiment includes a step in which a resist composition of the embodiment is applied on a surface of a substrate to be processed to form a resist film, a step in which the resist film is exposed to light, and a step in which the resist film exposed to light is developed using a developing solution.

Each step may be conducted by a well-known method.

According to the method for producing a substrate of the present embodiment, a steady result of highly accurate fine resist patterns is achieved.

An embodiment of the method for manufacturing a substrate with patterns formed thereon is described below.

First, a resist composition of the present embodiment is applied by spin coating or the like on a surface of a substrate such as a silicon wafer to form fine patterns as desired. Then, the substrate with the applied resist composition is dried through baking treatment (prebaking) to form a resist film.

Next, a photomask is placed on the resist film, which is then exposed to light to form latent images. Light with a wavelength of 250 nm or shorter is preferred for such exposure. For example, KrF excimer laser, ArF excimer laser, $F_2$ excimer laser or EUV light is preferred, and ArF excimer laser light is especially preferred. Electron beams may also be used.

Alternatively, immersion exposure may be conducted by interposing a high refractive index liquid such as pure water, perfluoro-2-butyltetrahydrofuran, perfluorotrialkylamine or the like between the resist film and the final lens of an exposure apparatus so as to perform exposure.

After the exposure, thermal treatment (post-exposure bake, PEB) is conducted if necessary, an alkaline developing solution is brought into contact with the resist film so as to dissolve the exposed portions in the developing solution and to remove (development). Any well-known alkaline developing solution may be used here.

After development, the substrate is rinsed with pure water or the like. Accordingly, resist patterns are formed on the substrate.

The substrate with resist patterns is thermally treated (post bake) to reinforce the resist, and portions without the resist are selectively etched.

After the etching, the resist is removed with a remover. Accordingly, a substrate with fine patterns is obtained.

When used for forming a resist composition, the polymer for lithographic applications obtained by the production method of the present embodiment has excellent solubility in a solvent, and shows high transmittance of photolithographic irradiation light. When transmittance of irradiation light is enhanced, sensitivity improves.

Also, if the solubility of a solvent is excellent, it is easier to dissolve the polymer in a resist solvent, and an excellent resist composition is prepared. Such a resist composition exhibits excellent solubility in an alkaline developing solution and contributes to enhanced sensitivity. In addition, since such a resist composition has fewer insoluble components, defects caused by the insoluble components are less likely to occur in patterns.

Therefore, according to the production method of a substrate, by using the resist composition of the present embodiment, highly accurate fine resist patterns with fewer defects are formed in a stable condition on a substrate. In addition, the resist composition of the present embodiment is suitable to be used for forming patterns by photolithography or electro-beam lithography that uses light with a wavelength of 250 nm or shorter such as ArF excimer laser (193 nm) for the exposure process, and requires a resist composition showing high sensitivity and high resolution.

EXAMPLES

In the following, the present invention is described according to examples. However, the present invention is not limited to those examples. Also, "parts" in examples and comparative examples are "parts by mass" unless otherwise indicated. Measurement methods and evaluation methods are as follows.

<Measuring Molecular Weight>

The weight-average molecular weight (Mw), number-average molecular weight (Mn) and molecular-weight distribution (Mw/Mn) of a monomer were obtained using gel permeation chromatography under the following conditions (GPC conditions) in terms of polystyrene.

[GPC Conditions]

Instrument: HLC-8220GPC (brand name), Tosoh high-performance GPC system, made by Tosoh Biochemical LLC Separation column: three Shodex GPC K-805L (brand name) connected in series, made by Showa Denko K.K.

Measurement temperature: 40° C.

Eluent: tetrahydrofuran (THF)

Sample (for a polymer): solution prepared by dissolving approximately 20 grams of a polymer in 5 mL of THF and by filtering the mixture using a 0.5 µm-membrane filter Sample (for a polymerization solution): solution prepared by dissolving approximately 30 mg of the sample polymerization solution in 5 mL of THF and by filtering the mixture using a 0.5 µm-membrane filter Flow rate: 1 mL/min Injection amount: 0.1 mL Detector: differential refractometer (refractive index detector).

Calibration curve (I): a solution was prepared by dissolving approximately 20 mg of standard polystyrene in 5 mL of THF, which was then filtered using a 0.5 μm-membrane filter. The prepared solution was injected into the separation column under the above conditions and the relationship between the elution time and the molecular weight was obtained. Standard types of polystyrene made by Tosoh Biochemical LLC (each is a brand name) were used.

F-80 (Mw=706,000)

F-20 (Mw=190,000)

F-4 (Mw=37,900)

F-1 (Mw=10,200)

A-2500 (Mw=2,630)

A-500 (a mixture of Mw=682, 578, 474, 370, 260)

<Measuring GPC Area Proportion of Molecular Weight of 1000 or Less>

The same as above, the molecular weight was measured to calculate the rate of positive peak areas corresponding to molecular weight of 1000 or less to all the peak areas of the polymer shown on the elution curve detected by a differential refractometer (rate (%) of GPC areas of molecular weight of 1000 or less).

<Determination of Polymerization Rate>

The residual amount of each monomer remaining in the polymerization mixture was obtained by the following method.

From the reactor, 0.5 grams of the polymerization mixture was taken and diluted by acetonitrile to set the entire amount to be 50 mL using a measuring flask. The dilution was filtered using a 0.2 μm-membrane filter. Then, the unreacted amount of each monomer (residual monomer amount) in the dilution was measured using a high-performance liquid chromatograph HPLC-8020 (brand name), made by Tosoh Biochemical LLC.

The amount of each polymerized monomer was calculated by subtracting the residual monomer amount from the entire amount of the monomer supplied to the reactor. Then, the polymerization rate (mass %) was obtained as the rate of the amount of the polymerized monomer to the entire amount of the monomer supplied to the reactor.

The following were used for the measurement above.

One separation column: Inertsil ODS-2 (brand name) made by GL Science, Inc.

Mobile phase: water/acetonitrile gradient

Flow rate: 0.8 mL/min.

Detector: UV-8020 (brand name) UV-visible spectrophotometer, made by Tosoh Biochemical LLC Detection wavelength: 220 nm Measurement temperature: 40° C.

Injection amount: 4 μL

As a separation column, Inertsil ODS-2 (brand name), silica gel with a particle diameter of 5 μm and a 4.6-mm inner diameter×450-mm long column, was used. Also, the gradient conditions of the mobile phase were as follows, using solution A of water and solution B of acetonitrile. To determine the unreacted amount of a monomer, monomer solutions with different concentration rates were used as standard samples.

Measurement time 0 through 3 minutes: solution A/solution B=90 volume %/10 volume %

Measurement time 3 through 24 minutes: solution A/solution B=90 volume %/10 volume % to 50 volume %/50 volume %

Measurement time 24 through 36.5 minutes: solution A/solution B=50 volume %/50 volume % to 0 volume %/100 volume %

Measurement time 36.5 through 44 minutes: solution A/solution B=0 volume %/100 volume %

<Determination of End Group Having Thiocarbonylthio Structure>

A sample solution was prepared by dissolving 5 parts of the polymer in approximately 95 parts of dimethylsulfoxide. The sample solution was placed into an NMR tube and analyzed using $^1$H-NMR (made by JEOL Ltd., resonance frequency of 270 MHz). From the integrated intensity of the signal derived from the thiocarbonylthio structure present in an end of the polymer chain, the ratio of the end group having a thiocarbonylthio structure to all the end groups of the polymer chain was calculated. The ratio corresponds to the ratio of the end group having a thiocarbonylthio structure (RAFT residue) to all the end groups of the polymer chain.

In the following examples, the ends (growing ends) of the polymer chain are either a polymerization initiator residue (not containing a sulfur atom) or RAFT residue (containing a sulfur atom). Thus, the number of moles of the end group having a sulfur atom is the number of moles of the end group having a thiocarbonylthio structure.

The sum of the end groups not containing a sulfur atom and the end groups containing a sulfur atom is the totality of the end groups. A lower ratio of end groups containing a sulfur atom means less RAFT residue remaining at the ends of the polymer chain.

<Determination of Organic Acid (Structural Unit Acting as Organic Acid)>

In a polymer in the following examples, a group capable of generating organic acid is limited to an acid leaving group and RAFT agent residue remaining at an end of the polymer chain. When the acid leaving group or RAFT agent residue is decomposed by heat or acid, carboxylic acid or dithiocarboxylic acid is generated as a result. Therefore, the sum of the number of moles of structural units having a carboxylic-acid structure or a dithiocarboxylic-acid structure is the number of moles of structural units acting as organic acids in the polymer.

The ratio (amount of organic acid contained in the polymer) of the number of structural units acting as organic acid to the number of all the structural units in the polymer was obtained by the following method.

A sample solution was prepared by dissolving approximately 5 parts of the polymer in approximately 95 parts of dimethylsulfoxide. The sample solution was placed into an NMR tube and analyzed using $^1$H-NMR (made by JEOL Ltd., resonance frequency of 270 MHz). From the integrated intensity of the signal derived from the carboxylic-acid structure and dithiocarboxylic-acid structure, the proportion (mol %) of structural units acting as organic acid to the number of all the structural units was calculated. Signals derived from the carboxylic-acid or dithiocarboxylic-acid structure are observed near each other in the $^1$H-NMR analysis.

<Evaluation of Polymer Solubility>

Ten parts of a polymer and 90 parts of PGMEA were mixed and stirred under constant conditions while a temperature of 25° C. was maintained. Whether or not the polymer was completely dissolved was visually determined, and the time until complete dissolution was recorded. The shorter the time taken until complete dissolution, the better was the solubility of the polymer.

<Evaluation of Transparency of Resist Composition>

The resist composition was spin-coated on a 4-inch quartz wafer and prebaked (PAB) on a hotplate at 120° C. for 60 seconds to form 1000 nm-thick resist film. Using a UV-visible spectrophotometer (brand name: UV-3100, made by Shimadzu Corporation), the transmittance of 193 nm light was measured. "193 nm" is the wavelength of ArF excimer laser light.

<Evaluation of Sensitivity of Resist Composition>

The resist composition was spin-coated on a 6-inch silicon wafer and prebaked (PAB) on a hotplate at 120° C. for 60 seconds to form 300 nm-thick resist film.

Using an ArF excimer laser exposure instrument (brand name: VUVES-4500, made by Litho Tech Japan Corp.), 18-shot irradiation was conducted on a 10 mm×10 mm area while the exposure amount was changed.

Next, the resist film was post-baked (PEB) at 110° C. for 60 seconds and developed for 65 seconds in a 2.38% tetramethylammonium hydroxide solution at 23.5° C. using a resist development analyzer (brand name: RDA-806, made by Litho Tech Japan Corp.) For each resist film exposed to different amounts of light, chronological change in the resist film thickness during development was measured.

Based on the data on chronological change in the resist film thickness, by plotting the relationship between the logarithm of exposure amount (mJ/cm²) and the rate (%) of remaining film thickness after development of 30 seconds relative to the initial film thickness (hereinafter referred to as a residual film rate), a curve showing the relationship of an exposure amount to the residual film rate was prepared. Based on the curve, the necessary exposure amount (Eth) to achieve the residual film rate of 0% was obtained. Namely, the exposure amount (mJ/cm²) obtained at the point where the curve showing the relationship of an exposure amount to the residual film rate crosses the straight line at a residual film rate of 0% was set as (Eth). The value of (Eth) indicates sensitivity; the lower the value (Eth), the higher the sensitivity.

In the examples, monomers (m-1), (m-2), (m-3), (m-4), RAFT agent (R-1), polymerization initiators (I-1), (I-2) are as follows.

monomer (m-1): compound represented by formula (m-1) shown below.

monomer (m-2): compound represented by formula (m-2) shown below.

monomer (m-3): compound represented by formula (m-3) shown below.

monomer (m-4): compound represented by formula (m-4) shown below.

RAFT agent (R-1): compound represented by formula (R-1) shown below.

polymerization initiator (I-1): dimethyl-2,2'-azobisisobutylate, V601 (brand name), made by Wako Pure Chemical Industries.

polymerization initiator (I-2): 2,2'-azobis(2,4-dimethylvaleronitrile, V65 (brand name), made by Wako Pure Chemical Industries.

chemical formulas 3

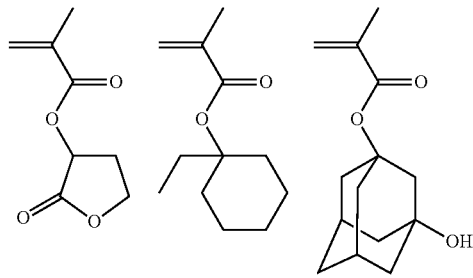

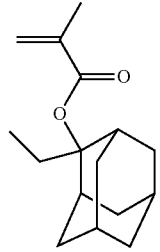

chemical formula 4

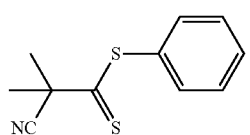

(R-1)

Example 1

In a 25 mL Schlenk flask, 8.4 parts of PGMEA, 2.72 parts of monomer (m-1), 3.07 parts of monomer (m-2), 1.89 parts of monomer (m-3), 0.18 parts (0.8 mmol) of RAFT agent (R-1) were supplied, and nitrogen was blown at 200 mL/min for 1 minute into the mixture in the flask. Then, the flask was placed over an 80° C. heating bath to raise the temperature inside the flask to 80° C. (predetermined polymerization temperature).

Ten minutes after the temperature reached 80° C., a solution containing 1.0 part of PGMEA, 0.050 parts (0.2 mmol) of polymerization initiator (I-1) and 0.002 parts (0.02 mmol) of triethylamine was supplied into the flask all at once, and the mixture in the flask was stirred for 5 hours while its temperature was maintained.

Next, a solution containing 0.5 parts of PGMEA and 0.992 parts (4 mmol) of polymerization initiator (I-2) was added into the flask all at once, and after the mixture was stirred for an hour while its temperature was maintained, a solution containing 0.5 parts of PGMEA and 0.992 parts (4 mmol) of polymerization initiator (I-2) was further supplied into the flask all at once, and the mixture was stirred for an hour while its temperature was maintained. Then, the reaction mixture was cooled to room temperature to terminate the reaction. Residual monomer amounts in the reaction mixture at that time were determined and the polymerization rate was obtained. The results are shown in Table 1.

In the present example, the time when the temperature in the flask reached 80° C. is set as ($T_0$), and the time when cooling the reaction mixture in the flask started is set as ($T_1$). Amount ($I_A$) of the polymerization initiators supplied between ($T_0$) and ($T_1$) was (0.05+0.992+0992) parts. Amount ($I_B$) of the polymerization initiators supplied between ($T_1$-$T_0$)/2 and ($T_1$) was (0.992+0992) parts. Thus, ($I_B$)/($I_A$)=0.975.

<Purification of Polymer>

The polymerization mixture in the flask was added drop by dropp into a heptane solution of approximately 10 times the amount of the polymerization mixture while the mixture was being stirred, and a sedimentation of a white precipitate (polymer A-1) was obtained. The sedimentation was filtered and put into the same amount of methanol as above and washed while the mixture was being stirred. Then, the sedimentation after washing was filtered again to obtain a wet polymer powder. The wet polymer powder was dried at 40° C. for approximately 40 hours under reduced pressure. For obtained polymer (A-1), Mw, Mw/Mn, the rate of GPC areas of molecular weight of 1000 or less, the content of sulfur atoms at an end of the polymer chain (the proportion of end groups containing a sulfur atom to all the end groups of the polymer) and organic acid content were measured to evaluate the solubility of the polymer. The results are shown in Table 1.

<Preparing Resist Composition>

A solution containing 100 parts of polymer (A-1), 2 parts of triphenylsulfonium triflate as a photoacid generator and PGMEA as a solvent was mixed homogeneously to have a polymer concentration of 10.0 mass % and filtered using a 0.1 μm-diameter membrane filter to obtain a resist composition. The transparency and sensitivity of the resist composition was evaluated using the above method. The results are shown in Table 1.

Example 2

The same steps for supplying PGMEA, monomers (m-1), (m-2) and (m-3) and RAFT agent (R-1) in a Schlenk flask, blowing nitrogen and raising the temperature in the flask to 80° C. were conducted as in example 1.

Ten minutes after the temperature reached 80° C., a solution containing 1.0 part of PGMEA, 0.050 parts (0.2 mmol) of polymerization initiator (I-1) and 0.002 parts (0.02 mmol) of triethylamine was supplied into the flask all at once, and the mixture was stirred for 5 hours while its temperature was maintained.

Next, a solution containing 1.0 parts of PGMEA and 1.84 parts (8 mmol) of polymerization initiator (I-1) was added into the flask all at once, and the mixture was stirred for 2 hours while its temperature was maintained. Then, the reaction mixture was cooled to room temperature to terminate the reaction. The residual monomer amount in the reaction mixture at that time was determined and the polymerization rate was obtained. The results are shown in Table 1.

In the present example, amount $(I_A)$ of the polymerization initiator supplied between $(T_0)$ and $(T_1)$ was (0.05+1.84) parts. Amount $(I_B)$ of the polymerization initiator supplied between $(T_1-T_0)/2$ and $(T_1)$ was 1.84 parts. Thus, $(I_B)/(I_A)=$ 0.974.

The polymerization mixture was purified the same as in example 1 to obtain polymer (A-2). Measurements and evaluation were conducted the same as in example 1. The results are shown in Table 1.

Example 3

The same steps for supplying PGMEA, monomers (m-1), (m-2) and (m-3) and RAFT agent (R-1) in a Sehlenk flask, blowing nitrogen and raising the temperature in the flask to 80° C. were conducted as in example 1.

Ten minutes after the temperature of the solution reached 80° C., a solution containing 1.0 parts of PGMEA, 0.050 parts (0.2 mmol) of polymerization initiator (I-2) and 0.002 parts (0.02 mmol) of triethylamine was added into the flask all at once, and the mixture was stirred for 4 hours while its temperature was maintained.

Next, a solution containing 1.0 parts of PGMEA and 0.055 parts (0.22 mmol) of polymerization initiator (I-2) was supplied into the flask all at once, and the mixture was stirred for 3 hours while its temperature was maintained. Then, the reaction mixture was cooled to room temperature to terminate the reaction. The residual monomer amounts in the reaction mixture at that time were determined and the polymerization rate was obtained. The results are shown in Table 1.

In the present example, amount $(I_A)$ of the polymerization initiator supplied between $(T_0)$ and $(T_1)$ was (0.05+0.055) parts. Amount $(I_B)$ of the polymerization initiator supplied between $(T_1-T_0)/2$ and $(T_1)$ was 0.055 parts. Thus, $(I_B)/(I_A)=$ 0.524.

The polymerization mixture was purified the same as in example 1 to obtain polymer (A-3). Measurements and evaluation were conducted the same as in example 1. The results are shown in Table 1.

Example 4

In a flask with the attached nitrogen inlet, condenser, stirrer, dropping funnel and thermometer, 42.0 parts of PGMEA, 13.60 parts of monomer (m-1), 15.68 parts of monomer (m-2), 9.44 parts of monomer (m-3) and 1.77 parts (8 mmol) of RAFT agent (R-1) were supplied under nitrogen atmosphere. The flask was put over a heating bath and the temperature of the hot bath was raised to 80° C. while the mixture in the flask was being stirred.

Ten minutes after the temperature in the flask reached 80° C., a solution containing 4.4 parts of PGMEA, 0.23 parts (1 mmol) of polymerization initiator (I-1) and 0.081 parts (0.8 mmol) of triethylamine was added into the flask all at once, while 13.60 parts of monomer (m-1), 15.68 parts of monomer (m-2), 9.44 parts of monomer (m-3), 47.3 parts of PGMEA and 0.23 parts (1 mmol) of polymerization initiator (I-1) in the dropping funnel were added drop by drop out in 4 hours at a constant rate. Then, the mixture was stirred for an hour while the temperature was maintained. Next, after 27.6 parts of PGMEA and 18.4 parts (80 mmol) of polymerization initiator (I-2) in the dropping funnel were added drop by drop into the flask at a constant rate for 10 minutes, the mixture was stirred for one hour and 50 minutes while its temperature was maintained. Then, the reaction mixture was cooled to room temperature to terminate the reaction. Residual monomer amounts at that time were determined to obtain the polymerization rate. The results are shown in Table 1.

In the present example, amount $(I_A)$ of the polymerization initiators supplied between $(T_0)$ and $(T_1)$ was (0.23+0.23+18.4) parts. Amount $(I_B)$ of the polymerization initiators supplied between $(T_1-T_0)/2$ and $(T_1)$ was (0.029+18.40) parts. Thus, $(I_B)/(I_A)=0.977$.

The polymerization mixture was purified the same as in example 1 to obtain polymer (A-4). Measurements and evaluation were conducted the same as in example 1. The results are shown in Table 1.

Example 5

In a Schlenk flask, 4.2 parts of PGMEA, 1.36 parts of monomer (m-1), 1.98 parts of monomer (m-4), 0.94 parts of monomer (m-2), 0.09 parts (0.4 mmol) of RAFT agent (R-1)

were supplied, and nitrogen was blown at 200 mL/min for 1 minute into the solution in the flask. Then, the flask was placed over an 80° C. heating bath to raise the temperature inside the flask to 80° C. (predetermined polymerization temperature).

Ten minutes after the temperature reached 80° C., a solution containing 1.0 part of PGMEA, 0.023 parts (0.1 mmol) of polymerization initiator (I-1), and 0.008 parts (0.08 mmol) of triethylamine was supplied into the flask all at once, and the mixture in the flask was stirred for 5 hours while the temperature was maintained.

Next, a solution containing 1.0 part of PGMEA and 1.84 parts (8 mmol) of polymerization initiator (I-1) was added into the flask all at once, and after the mixture was stirred for 2 hours while its temperature was maintained, the reaction mixture was cooled to room temperature to terminate the reaction. Residual monomer amounts in the reaction mixture at that time were determined and the polymerization rate was obtained. The results are shown in Table 1.

In the present example, amount ($I_A$) of the polymerization initiator supplied between ($T_0$) and ($T_1$) was (0.023+1.84) parts. Amount ($I_B$) of the polymerization initiator supplied between ($T_1-T_0$)/2 and ($T_1$) was 1.84 parts. Thus, ($I_B$)/($I_A$)= 0.988.

The polymerization mixture in the flask was added drop by drop into a mixed solution of heptane/isopropanol (volume ratio of 70/30) at approximately 10 times the amount of the polymerization mixture while the mixture was being stirred, and a white sedimentation (polymer A-5) was obtained. The sedimentation was filtered and put again into the same amount of methanol as above and washed while being stirred. Then, the sedimentation after washing was filtered to obtain a wet polymer powder. The wet polymer powder was dried at 40° C. for approximately 40 hours under reduced pressure. For obtained polymer (A-5), the same measurements and evaluation were conducted as in example 1. The results are shown in Table 1.

Example 6

In a Schlenk flask, 4.2 parts of PGMEA, 1.36 parts of monomer (m-1), 1.98 parts of monomer (m-4), 0.94 parts of monomer (m-2) and 0.09 parts (0.4 mmol) of RAFT agent (R-1) were supplied, and nitrogen was blown at 200 mL/min for 1 minute into the solution in the flask. Then, the flask was placed over an 80° C. heating bath to raise the temperature inside the flask to 80° C.

Ten minutes after the temperature reached 80° C., a solution containing 1.0 part of PGMEA, 0.023 parts (0.1 mmol) of polymerization initiator (I-1), and 0.008 parts (0.08 mmol) of triethylamine was added into the flask all at once, and the mixture in the flask was stirred for 7 hours while its temperature was maintained. Then, the reaction mixture was cooled to room temperature to terminate the reaction. Residual monomer amounts in the reaction mixture at that time were determined and the polymerization rate was obtained. The results are shown in Table 1.

In the present example, amount ($I_A$) of the polymerization initiator supplied between ($T_0$) and ($T_1$) was 0.023 parts. Amount ($I_B$) of the polymerization initiator supplied between ($T_1-T_0$)/2 and ($T_1$) was zero. Thus, ($I_B$)/($I_A$)=0.

The polymerization mixture was purified the same as in example 5 to obtain polymer (A-6). Measurements and evaluation were conducted the same as in example 1. The results are shown in Table 1.

Comparative Example 1

The same steps for supplying PGMEA, monomers (m-1), (m-2) and (m-3) and RAFT agent (R-1) in a Schlenk flask, blowing nitrogen and raising the temperature in the flask to 80° C. were conducted as in example 1.

Ten minutes after the temperature reached 80° C., a solution containing 1.0 part of PGMEA and 0.050 parts (0.2 mmol) of polymerization initiator (I-1) was added into the flask all at once, and the mixture in the flask was stirred for 7 hours while its temperature was maintained. Then, the reaction mixture was cooled to room temperature to terminate the reaction. Residual monomer amounts in the reaction mixture at that time were determined and the polymerization rate was obtained. The results are shown in Table 1.

In the present example, amount ($I_A$) of the polymerization initiator supplied between ($T_0$) and ($T_1$) was 0.05 parts. Amount ($I_B$) of the polymerization initiator supplied between ($T_1-T_0$)/2 and ($T_1$) was zero. Thus, ($I_B$)/($I_A$)=0.

The polymerization mixture was purified the same as in example 1 to obtain polymer (B-1). Measurements and evaluation were conducted the same as in example 1. The results are shown in Table 1.

Comparative Example 2

The same steps for supplying PGMEA, monomers (m-1), (m-2) and (m-3) and RAFT agent (R-1) in a Schlenk flask, blowing nitrogen and raising the temperature in the flask to 80° C. were conducted as in example 1.

Ten minutes after the temperature reached 80° C., a solution containing 1.0 part of PGMEA and 0.050 parts (0.2 mmol) of polymerization initiator (I-2) was added into the flask all at once, and the mixture in the flask was stirred for 7 hours while its temperature was maintained. Then, the reaction was terminated by cooling the reaction mixture to room temperature. Residual monomer amounts in the reaction mixture at that time were determined and the polymerization rate was obtained. The results are shown in Table 1.

In the present example, amount ($I_A$) of the polymerization initiator supplied between ($T_0$) and ($T_1$) was 0.05 parts. Amount ($I_B$) of the polymerization initiator supplied between ($T_1-T_0$)/2 and ($T_1$) was zero. Thus, ($I_B$)/($I_A$)=0.

The polymerization mixture was purified the same as in example 1 to obtain polymer (B-2). Measurements and evaluation were conducted the same as in example 1. The results are shown in Table 1.

Comparative Example 3

In a Schlenk flask, 8.4 parts of PGMEA, 2.72 parts of monomer (m-1), 3.07 parts of monomer (m-2), 1.89 parts of monomer (m-3), 0.18 parts (0.8 mmol) of RAFT agent (R-1) and 0.050 parts (0.2 mmol) of polymerization initiator (I-2) were supplied, and nitrogen was blown at 200 mL/min for 1 minute into the solution in the flask. Then, the flask was placed over an 80° C. heating bath to raise the temperature inside the flask to 80° C. It took one hour for the temperature in the flask to reach 80° C.

After the temperature reached 80° C., the mixture was stirred for 5 hours while its temperature was maintained.

Next, a solution containing 0.5 parts of PGMEA and 0.050 parts (0.2 mmol) of polymerization initiator (I-2) was added into the flask all at once, and the mixture in the flask was stirred for 2 hours while its temperature was maintained. Then the reaction mixture was cooled to room temperature to terminate the reaction. Residual monomer amounts in the reaction mixture at that time were determined and the polymerization rate was obtained. The results are shown in Table 1.

In the present example, the time when the temperature in the flask reached 80° C. is set as ($T_0$), and the time when cooling the reaction mixture started is set as ($T_1$). Mass amount ($I_A$) of the polymerization initiator supplied between ($T_0$) and ($T_1$) was 0.050 parts. Amount ($I_B$) of the polymerization initiator supplied between ($T_1$-$T_0$)/2 and ($T_1$) was 0.050 parts. Thus, ($I_B$)/($I_A$)=1.

The polymerization mixture was purified the same as in example 1 to obtain polymer (B-3). Measurements and evaluation were conducted the same as in example 1. The results are shown in Table 1.

Comparative Example 4

The same steps for supplying PGMEA, monomers (m-1), (m-4) and (m-3) and RAFT agent (R-1) in a Schlenk flask, blowing nitrogen and raising the temperature in the flask to 80° C. were conducted as in example 5.

Ten minutes after the temperature reached 80° C., a solution containing 1.0 part of PGMEA and 0.023 parts (0.1 mmol) of polymerization initiator (I-1) was added into the flask all at once, and the mixture in the flask was stirred for 7 hours while its temperature was maintained. Then the reaction mixture was cooled to room temperature to terminate the reaction. A while solid precipitated in the reaction mixture 2.5 hours after the polymerization initiator was added, but the reaction was continued in a heterogeneous reaction system. Residual monomer amounts in the reaction mixture after the reaction was terminated were determined and the polymerization rate was obtained. The results are shown in Table 1.

In the present example, amount ($I_A$) of the polymerization initiator supplied between ($T_0$) and ($T_1$) was 0.023 parts. Amount ($I_B$) of the polymerization initiator supplied between ($T_1$-$T_0$)/2 and ($T_1$) was zero. Thus, ($I_B$)/($I_A$)=0.

The polymerization mixture was purified the same as in example 1 to obtain polymer (B-4). Measurements and evaluation were conducted the same as in example 1. The results are shown in Table 1.

In examples 1 to 5, where each polymer mixture was purified by being brought into contact with both a polar protic poor solvent and a nonpolar aprotic poor solvent, the rate of GPC areas of molecular weight at 1000 or less is small, each polymer has excellent solubility, and resist film has high transmittance of ArF excimer laser light with a wavelength (193 nm), and exhibits excellent transparency and sensitivity.

In each of examples 1 to 6, a basic compound was also present in the reaction system, and organic acid (structural unit acting as an organic acid) was not detected in obtained polymers (A-1) to (A-6). It is found that an acid leaving group during the polymerization was suppressed from decomposing.

By contrast, in comparative examples 1, 2 and 4, a basic compound was not present in the reaction system, and a polymerization initiator was not supplied additionally in the latter half of the polymerization (namely, ($I_B$)/($I_A$)=0). In each of those comparative examples, an organic acid derived from the decomposed acid leaving group (structural unit acting as organic acid) was detected, the polymerization rate was low, and the ratio of end groups containing a sulfur atom was high. Especially, since a large amount of organic acid (structural unit acting as an organic acid) was produced during polymerization in comparative example 4, reaction in a homogeneous system could not be continued and the polymer did not dissolve in a resist solvent. Thus, evaluation results on transparency and sensitivity were not obtained.

Also, in example 3, a basic compound did not coexist in the reaction system, a polymerization initiator was supplied before the solution temperature in the reactor reached the polymerization temperature for the polymerization to progress, and the polymerization initiator was supplied additionally in the latter half of the polymerization (namely, ($I_B$)/($I_A$)=1). In example 3, an organic acid (structural unit acting as an organic acid) derived from the decomposed acid leaving group was detected, the dispersion in molecular weights was wide, the polymerization rate was low, and the ratio of end groups containing a sulfur atom was high.

TABLE 1

| | polymer | $I_B/I_A$ | polymerization rate [mass %] | Mw | Mw/Mn | proportion of end group with sulfur atom [mol %] | proporiton of structural unit acting as organic acid [mol %] | proportion of GPC areas of molecular weight 1000 or less [%] | solubility of polymer [min] | transmittance rate of resist film [%] | sensitivity [mJ/cm$^2$] |
|---|---|---|---|---|---|---|---|---|---|---|---|
| example 1 | A-1 | 0.975 | 94 | 9700 | 1.2 | 4 | 0 | 0.7 | 24 | 43.5 | 1.15 |
| example 2 | A-2 | 0.974 | 96 | 9800 | 1.2 | 6 | 0 | 0.6 | 22 | 47.2 | 1.12 |
| example 3 | A-3 | 0.524 | 92 | 8500 | 1.3 | 28 | 0 | 0.8 | 35 | 40.1 | 1.26 |
| example 4 | A-4 | 0.977 | 99 | 10400 | 1.2 | 3 | 0 | 0.3 | 15 | 48.3 | 1.03 |
| example 5 | A-5 | 0.974 | 95 | 9000 | 1.3 | 4 | 0 | 0.9 | 19 | 46.8 | 0.61 |
| example 6 | A-6 | 0 | 82 | 9200 | 1.2 | 78 | 0 | 1.3 | 26 | 35.1 | 1.36 |
| comparative example 1 | B-1 | 0 | 88 | 9200 | 1.2 | 81 | 3 | 1.4 | 45 | 34.7 | 1.61 |
| comparative example 2 | B-2 | 0 | 72 | 7600 | 1.3 | 79 | 3 | 1.5 | 57 | 33.2 | 1.55 |
| comparative example 3 | B-3 | 1 | 85 | 6900 | 1.5 | 65 | 4 | 1.4 | 42 | 36.1 | 1.48 |
| comparative example 4 | B-4 | 0 | 86 | 4300 | 2.0 | 43 | 32 | 1.3 | not dissolved | impossible to measure | impossible to measure |

As shown in Table 1, in each of polymers (A-1) to (A-5) obtained in examples 1 to 5, which satisfies 0.50<($I_B$)/($I_A$)<1.00, the molecular-weight distribution is narrowed, variation of molecular weight is small, the ratio of end groups containing a sulfur atom is low, and there is less RAFT agent residue remaining at an end of the polymer chain.

What is claimed is:

1. A polymer, comprising:
   a structural unit having a group to be modified by acid, comprising a structural unit derived from at least one monomer selected from the group consisting of 2-methyl-2-adamantyl (meth)acrylate, 2-ethyl-2-adamantyl (meth)acrylate, 1-(1'-adamantyl)-1-methylethyl (meth)acrylate, 1-methyl cyclohexyl (meth)acrylate, 1-ethyl cyclohexyl (meth)acrylate, 1-methyl cyclopentyl (meth)acrylate, 1-ethyl cyclopentyl (meth)acrylate, isopropyl adamantyl (meth)acrylate, and 1-ethyl cyclooctyl (meth)acrylate,
wherein the polymer has an end group having a thiocarbonylthio structure having the formula (10)

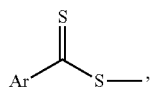
(10)

where Ar is an aromatic group or an aromatic group substituted with a halogen atom; a hydrogen group; an alkoxy group; an amino group; a nitro group; a cyano group; a group comprising carbonyl represented by —CORa in which Ra is an alkyl group or an allyl group having 1 to 8 carbon atoms or an alkoxy group or allyloxy group having 1 to 8 carbon atoms; a sulfonyl group; or a trifluoromethyl group, in an amount of from 0.001 to 30 mol % relative to all growing end groups of the polymer, and
an amount of structural units that act as organic acid is less than 2 mol % relative to all structural units in the polymer.

2. The polymer according to claim 1, wherein the polymer is suitable for lithography applications.

3. The polymer according to claim 1, wherein the structural unit having a group to be modified by acid comprises a structural unit derived from at least one monomer selected from the group consisting of 1-ethyl cyclohexyl methacrylate, 2-ethyl-2-adamantyl methacrylate, 1-ethyl cyclopentyl methacrylate, and isopropyl adamantyl methacrylate.

4. The polymer according to claim 1, wherein an amount of the structural unit having a group to be modified by acid is from 20 to 60 mol % relative to all structural units in the polymer.

5. The polymer according to claim 1, wherein the thiocarbonylthio structure of the end group of the polymer is derived from a chain transfer agent having the thiocarbonylthio structure.

6. The polymer according to claim 1, further comprising:
a structural unit having a group with a lactone skeleton; and
a structural unit having a hydrophilic group.

7. The polymer according to claim 1, wherein, in the formula, Ar is an aromatic group.

8. The polymer according to claim 1, wherein
a weight-average molecular weight of the polymer measured by gel permeation chromatography with a differential refractive index detector and determined in terms of polystyrene is from 2,500 to 1,000,000, and
a peak area corresponding to a molecular weight of no greater than 1,000 in an elution curve is no greater than 1.0% of all peak areas of the polymer.

9. The polymer according to claim 8, wherein the structural unit having a group to be modified by acid comprises a structural unit derived from at least one monomer selected from the group consisting of 1-ethyl cyclohexyl methacrylate, 2-ethyl-2-adamantyl methacrylate, 1-ethyl cyclopentyl methacrylate, and isopropyl adamantyl methacrylate.

10. The polymer according to claim 8, further comprising:
a structural unit having a group with a lactone skeleton.

11. The polymer according to claim 8, further comprising:
a structural unit having a hydrophilic group.

12. The polymer according to claim 8, wherein an amount of the structural unit having a group to be modified by acid is from 20 to 60 mol % relative to all structural units in the polymer.

13. The polymer according to claim 8, further comprising:
a structural unit having a group with a lactone skeleton; and
a structural unit having a hydrophilic group.

14. The polymer according to claim 8, wherein, in the formula, Ar is an aromatic group.

15. The polymer according to claim 1, further comprising:
a structural unit having a group with a lactone skeleton.

16. The polymer according to claim 15, wherein an amount of the structural unit having a group with a lactone skeleton is from 20 to 60 mol % relative to all structural units in the polymer.

17. The polymer according to claim 15, wherein the structural unit having a group with a lactone skeleton comprises a structural unit derived from at least one monomer selected from the group consisting of β-(meth)acryloyloxy-β-methyl-δ-valerolactone, 4,4-dimethyl-2-methylene-γ-butyrolactone β-(meth)acryloyloxy-γ-butyrolactone, β-(meth)acryloyloxy-β-methyl-γ-butyrolactone, α-(meth)acryloyloxy-γ-butyrolactone, 2-(1-(meth)acryloyloxy)ethyl-4-butanolide (meth)acrylic acid pantoyl lactone, 5-(meth)acryloyloxy-2,6-norbornane carbolactone, 8-methacryloxy-4-oxatricyclo[5.2.1.0$^{2,6}$]decane-3-one, and 9-methacryloxy-4-oxatricyclo[5.2.1.0$^{2,6}$]decane-3-one.

18. The polymer according to claim 1, further comprising:
a structural unit having a hydrophilic group.

19. The polymer according to claim 18, wherein an amount of the structural unit having a hydrophilic group is from 5 to 50 mol % relative to all structural units in the polymer.

20. The polymer according to claim 18, wherein the structural unit having a hydrophilic group comprises a structural unit derived from at least one monomer selected from the group consisting of (meth)acrylic acid, 2-hydroxyethyl (meth)acrylate, 3-hydroxypropyl (meth)acrylate, 2-hydroxy-n-propyl (meth)acrylate, 4-hydroxybutyl (meth)acrylate, 3-hydroxyadmantyl (meth)acrylate, 2- or 3-cyano-5-norbornene (meth)acrylate, and 2-cyanomethyl-2-adamantyl (meth)acrylate.

* * * * *